United States Patent
Doppalapudi et al.

(10) Patent No.: US 11,309,876 B2
(45) Date of Patent: Apr. 19, 2022

(54) DIGITALLY PROGRAMMABLE ANALOG DUTY-CYCLE CORRECTION CIRCUIT

(71) Applicant: MACOM Technology Solutions Holdings, Inc., Lowell, MA (US)

(72) Inventors: Naga Rajesh Doppalapudi, Santa Clara, CA (US); Mahmoud Reza Ahmadi, Santa Clara, CA (US); Echere Iroaga, Santa Clara, CA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 16/686,731

(22) Filed: Nov. 18, 2019

(65) Prior Publication Data

US 2021/0152167 A1  May 20, 2021

(51) Int. Cl.
*H03K 5/156* (2006.01)
*H03M 1/66* (2006.01)
*H04J 3/06* (2006.01)

(52) U.S. Cl.
CPC ............ *H03K 5/1565* (2013.01); *H03M 1/66* (2013.01); *H04J 3/062* (2013.01)

(58) Field of Classification Search
CPC ......... H03K 5/1565; H03K 3/017; H03K 7/08
See application file for complete search history.

(56) References Cited

U.S. PATENT DOCUMENTS

| 5,408,194 | A  | * | 4/1995  | Steinbach | G01R 19/30 |
|           |    |   |         |           | 327/355    |
| 6,967,514 | B2 | * | 11/2005 | Kizer     | H03K 5/1565 |
|           |    |   |         |           | 327/175    |
| 7,116,744 | B2 | * | 10/2006 | Saze      | G11C 7/1078 |
|           |    |   |         |           | 375/371    |
| 7,298,807 | B2 | * | 11/2007 | Zerbe     | G11C 7/22  |
|           |    |   |         |           | 375/355    |
| 7,463,075 | B2 | * | 12/2008 | White     | H03L 7/0814 |
|           |    |   |         |           | 327/175    |
| 7,668,698 | B2 | * | 2/2010  | Jiang     | H03K 5/135 |
|           |    |   |         |           | 327/141    |
| 7,839,194 | B2 | * | 11/2010 | Chang     | G06F 1/06  |
|           |    |   |         |           | 327/175    |
| 7,847,609 | B2 | * | 12/2010 | Shin      | H03K 5/159 |
|           |    |   |         |           | 327/175    |
| 8,125,259 | B2 | * | 2/2012  | Dai       | H03M 9/00  |
|           |    |   |         |           | 327/175    |

(Continued)

OTHER PUBLICATIONS

J. Cao, M. Green, A. Momtaz, K. Vakilian, D. Chung, K.-C. Jen, M. Caresosa, X. Wang, W.-G. Tan, Y. Cai, L. Fujimori, and A. Hairapetian, "OC-192 transmitter and receiver in standard 0.18-μm CMOS," IEEE Journal of Solid-State Circuits, vol. 37, No. 12, pp. 1768-1780, Dec. 2002.

(Continued)

*Primary Examiner* — Thomas J. Hiltunen
(74) *Attorney, Agent, or Firm* — Amin, Turocy & Watson, LLP

(57) ABSTRACT

Various aspects provide for a digitally programmable analog duty-cycle correction circuit. For example, a system includes a duty-cycle correction circuit and a duty-cycle distortion detector circuit. The duty-cycle correction circuit adjusts a clock associated with the transmitter. The duty-cycle distortion detector circuit facilitates digital control of a duty-cycle of the clock associated with the duty-cycle correction circuit based on duty-cycle distortion error associated with output of the transmitter.

19 Claims, 10 Drawing Sheets

(56) References Cited

U.S. PATENT DOCUMENTS

| | | | | |
|---|---|---|---|---|
| 8,401,098 | B2* | 3/2013 | Bae | H04L 25/0272 |
| | | | | 375/260 |
| 8,416,001 | B2* | 4/2013 | Ding | H03K 5/12 |
| | | | | 327/175 |
| 8,644,440 | B1 | 2/2014 | Ding | |
| 9,124,257 | B2* | 9/2015 | Desai | H03K 5/1565 |
| 9,148,135 | B2* | 9/2015 | Li | G06F 1/08 |
| 9,219,470 | B1* | 12/2015 | Venditti | H03K 5/1565 |
| 9,237,001 | B1* | 1/2016 | Song | H04L 7/0016 |
| 9,871,504 | B2* | 1/2018 | Clara | H03K 5/13 |
| 10,243,762 | B1 | 3/2019 | Kadkol et al. | |
| 10,284,182 | B2* | 5/2019 | Modi | G11C 7/222 |
| 10,447,254 | B1 | 10/2019 | Kadkol et al. | |
| 10,587,247 | B2* | 3/2020 | Tang | H03K 17/6871 |
| 2007/0146011 | A1 | 6/2007 | O'Mahony et al. | |
| 2015/0326189 | A1 | 11/2015 | Yang | |
| 2015/0372846 | A1 | 12/2015 | Pal et al. | |
| 2017/0179956 | A1* | 6/2017 | Lee | H03K 5/1565 |
| 2019/0229712 | A1* | 7/2019 | Suzuki | H03K 3/017 |
| 2020/0106429 | A1* | 4/2020 | Doppalapudi | H03K 5/05 |
| 2020/0106430 | A1* | 4/2020 | Martin | G06F 1/08 |

OTHER PUBLICATIONS

J. F. Bulzacchelli, M. Meghelli, S. V. Rylov, W. Rhee, A. V. Rylyakov, H. A. Ainspan, B. D. Parker, M. P. Beakes, A. Chung, T. J. Beukema, P. K. Pepeljugoski, L. Shan, Y. H. Kwark, S. Gowda, and D. J. Friedman, "A 10-GB/s 5-Tap DFE/4-Tap FFE Transceiver in 90-nm CMOS Technology," IEEE Journal of Solid-State Circuits, vol. 41, No. 12, pp. 2885-2900, Dec. 2006.

P. Chiang, W. J. Dally, M. J. E. Lee, R. Senthinathan, Y. Oh, and M. A. Horowitz, "A 20-GB/s 0.13-μm CMOS serial link transmitter using an LC-PLL to directly drive the output multiplexer," IEEE Journal of Solid-State Circuits, vol. 40, No. 4, pp. 1004-1011, Apr. 2005.

J. Kim, A. Balankutty, A. Elshazly, Y. Y. Huang, H. Song, K. Yu, and F. O'Mahony, "A 16-to-40Gb/s quarter-rate NRZ/PAM4 dual-mode transmitter in 14nm CMOS," in 2015 IEEE International Solid-State Circuits Conference—(ISSCC) Digest of Technical Papers, Feb. 2015, pp. 1-3.

Y. Frans, S. McLeod, H. Hedayati, M. Elzeftawi, J. Namkoong, W. Lin, J. Im, P. Upadhyaya, and K. Chang, "A 40-to-64 GB/s NRZ Transmitter With Supply-Regulated Front-End in 16nm FinFET," IEEE Journal of Solid-State Circuits, vol. 51, No. 12, pp. 3167-3177, Dec. 2016.

International Search Report & Written Opinion for PCT Application Serial No. PCT/US2020/061022, dated Mar. 4, 2021, 16 pages.

Vazgen Melikyan SH, et al. "Duty-Cycle Correction Circuit for High Speed Interfaces", 2019 IEEE 39th International Conference on Electronics and Nanotechnology, Apr. 16, 2019, pp. 42-45.

* cited by examiner

DIGITALLY PROGRAMMABLE ANALOG DUTY-CYCLE CORRECTION CIRCUIT

TECHNICAL FIELD

The subject disclosure relates generally to electronic circuits, and more particularly to transmitter circuitry, receiver circuitry and/or transceiver circuitry.

BACKGROUND

With ever increasing demand for higher data rates, operational data rates of transceivers continue to increase. For instance, increased operational data rates are beneficial for high-speed mobile connectivity, cloud-computing applications, storage applications and/or other technological applications. However, at higher operational data rates for a transceiver circuit, it is generally difficult to also improve performance of the transceiver circuit and/or to reduce power consumption of the transceiver circuit. In an example, multiplexers can be employed in a transmitter fabricated via a Complementary Metal-Oxide-Semiconductor (CMOS) process. However, conventional high speed full-rate multiplexers are power hungry and pose numerous implementation challenges in high frequency clock distribution circuits. Furthermore, conventional half-rate multiplexing architectures are sensitive to clock duty-cycle distortion. Moreover, quarter-rate multiplexers are sensitive to both duty-cycle error and quadrature error with respect to clocks. As such, conventional multiplexers, conventional transmitters and/or conventional transceivers that employ multiplexers can be improved.

The above-described description is merely intended to provide a contextual overview of current techniques and is not intended to be exhaustive.

SUMMARY

The following presents a simplified summary in order to provide a basic understanding of some aspects described herein. This summary is not an extensive overview of the disclosed subject matter. It is intended to neither identify key nor critical elements of the disclosure nor delineate the scope thereof. Its sole purpose is to present some concepts in a simplified form as a prelude to the more detailed description that is presented later.

In an example embodiment, a system for reducing error associated with a transmitter comprises a duty-cycle correction circuit and a duty-cycle distortion detector circuit. The duty-cycle correction circuit is configured to adjust a clock associated with the transmitter. The duty-cycle distortion detector circuit is configured to facilitate digital control of a duty-cycle of the clock associated with the duty-cycle correction circuit based on duty-cycle distortion error associated with output of the transmitter.

In another example embodiment, a system for digitally controlling an analog duty-cycle correction circuit comprises a transmitter and a duty-cycle distortion detector circuit. The transmitter is configured to generate output based on a clock associated with the analog duty-cycle correction circuit. The duty-cycle distortion detector circuit is configured to facilitate digital control of a duty-cycle of the clock associated with the analog duty-cycle correction circuit based on duty-cycle distortion error associated with the output of the transmitter.

In yet another example embodiment, a method comprises determining duty-cycle distortion error associated with output of a transmitter that is generated based on a clock associated with an analog duty-cycle correction circuit. The method also comprises generating a digital code associated with the duty-cycle distortion error. Furthermore, the method comprises digitally controlling a duty-cycle of the clock associated with the analog duty-cycle correction circuit based on the digital code associated with the duty-cycle distortion error.

The following description and the annexed drawings set forth in detail certain illustrative aspects of the subject disclosure. These aspects are indicative, however, of but a few of the various ways in which the principles of various disclosed aspects can be employed and the disclosure is intended to include all such aspects and their equivalents. Other advantages and novel features will become apparent from the following detailed description when considered in conjunction with the drawings.

DETAILED DESCRIPTION

Figure 1:
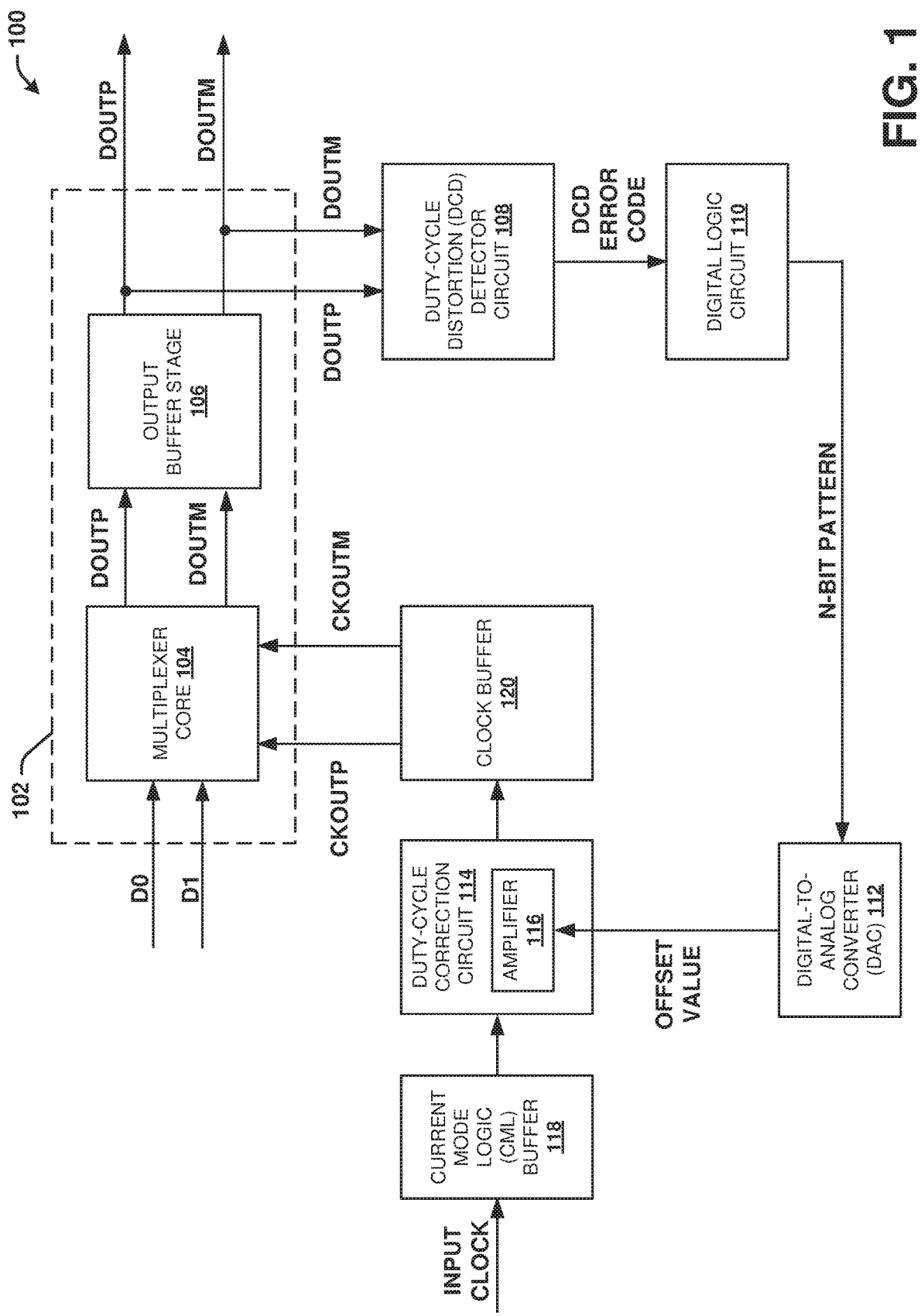
FIG. 1 illustrates an example, non-limiting embodiment of a system in accordance with various aspects described herein.

The disclosure herein is described with reference to the drawings, wherein like reference numerals are used to refer to like elements throughout. In the following description, for purposes of explanation, numerous specific details are set forth in order to provide a thorough understanding of the subject innovation. It may be evident, however, that various disclosed aspects can be practiced without these specific details. In other instances, well-known structures and devices are shown in block diagram form in order to facilitate describing the subject innovation.

The emergence of high-speed mobile connectivity, cloud-computing, storage applications, etc. has significantly increased demand for higher data transfer speeds in carrier networks as well as in data centers. To provide the higher data transfer speeds, an optical transceiver can employ PAM-4 and/or Forward Error Correction (FEC) schemes to achieve data rates beyond, for example, 100 Gbps over single-λ of a communication fiber. Alternatively, a coherent transceiver can employ dual polarization and/or higher-order modulation schemes to support, for example, data rates beyond 400 Gbps per λ. In both these cases, high speed transmitters utilizing multiplexers can be employed. A multiplexer is an electronic device that selects a signal from a group of signals (e.g., a group of signals received as input) and outputs the selected signal. In high speed multiplexing transmitters, multiplexers can be used to sequentially select between lower speed input signals in order to produce a combined output at a higher speed. In order to achieve this, high speed clock creation and distribution is required. However, high-speed clock generation and/or high-speed clock distribution is generally difficult to achieve with conventional transceivers and/or conventional multiplexers due to increased error (e.g., increased duty-cycle error and/or increased quadrature error) with an increase in operational speeds.

To address these and/or other issues, one or more embodiments described herein provide a digitally programmable analog duty-cycle correction circuit, which offers a number of benefits relative to conventional techniques, conventional transmitters, and/or conventional transceivers. For instance, a Complementary Metal-Oxide-Semiconductor (CMOS) multiplexing transmitter circuit implementation can be provided that can increase performance, increase operational speeds, reduce error, reduce power consumption, and/or reduce overall cost. In an aspect, a clock duty-cycle employed in a high-speed transmitter with an analog duty-cycle correction loop circuit can be digitally controlled. In another aspect, a digitally programmable analog duty-cycle correction circuit can be employed to compensate for duty-cycle distortion (DCD) errors caused by a data path circuit of a transmitter. In an embodiment, a DCD detector (e.g., a DCD detector circuit, a DCD detection circuit, etc.) can be implemented at an output of a transmitter. The DCD detector can generate, for example, a digital code (e.g., an error code, a DCD error code, etc.) corresponding to the DCD error. In another embodiment, a digital finite state machine (FSM) can monitor (e.g., periodically monitor) the digital code generated by the DCD detector. Furthermore, the digital FSM can generate an N-bit code based on the digital code to control current steering of a digital-to-analog converter (DAC) of the transmitter. The DAC (e.g., the N-bit current steering DAC) can generate an offset in an amplifier of the transmitter to, for example, nullify the output DCD error.

In embodiment, the DCD detector can be a fully differential DCD detection circuit. For instance, an input clock can be passed through an RC filter of the DCD detector to obtain an average value (e.g., an average voltage value, a differential average, a differential average voltage value, etc.). Furthermore, a comparator of the DCD detector can determine whether the average value is positive or negative. For example, a fifty-percent duty-cycle at input can correspond to an average value (e.g., a differential average voltage) of zero. Output of the comparator output can be accumulated, for example, to obtain an N-bit word for correction logic. In an embodiment, the DCD detector can include an accumulator (e.g., equivalent to a linear search). In another embodiment, the DCD detector can include a successive approximation register (e.g., equivalent to a binary search). In another embodiment, the digital FSM can further process data from the accumulator of the DCD detector. In certain embodiments, one or more bits of the N-bit word (e.g., a most significant bit of the N-bits) of the accumulator can be provided to the DAC. In certain embodiments, the accumulator can run and loop at start-up of the transmitter with a 1010 clock pattern from the transmitter. In an aspect, the digital code generated by the DCD detector (e.g., the converged DAC code) can represent a compensation code for data path systemic errors. In certain embodiments (e.g., during a normal mission mode), the accumulator can be implemented in a fixed state and a converged value can be applied to the DAC. In an alternate embodiment, a digital loop associated with the accumulator can be run continuously. In another aspect, the digital FSM can be implemented by hardware and/or firmware. In yet another embodiment, an amplifier (e.g., a differential amplifier) can be employed in an analog duty-cycle correction circuit associated with the transmitter. The analog duty-cycle correction circuit can, for example, provide one or more clocks for the transmitter.

In yet another embodiment, a digital-to-analog converter (DAC) can generate a systematic offset in the amplifier such that the output DCD error associated with the transmitter is nullified. The DAC can be, for example, an N-bit current steering DAC. In certain embodiments, the DAC can be employed to supply a portion of a bias current for a pair of transistors (e.g., an input differential pair of transistors) of the amplifier. In certain embodiments, the pair of transistors can be P-type metal-oxide-silicon (PMOS) transistor input version. Additionally or alternatively, in certain embodiments, the DAC can be a sinking N-type metal-oxide-silicon (NMOS) transistor current-steering DAC. In certain embodiments, the amplifier can include load PMOS current source devices split into two or more switchable devices by connecting gates to either bias voltage or supply rail to turn off respective switchable devices. Additionally or alternatively, current sources can be adjusted in differential fashion to create an offset. As such, performance of a transmitter (e.g., a multiplexing transmitter) can be improved. Additionally, error associated with a transmitter (e.g., a multiplexing transmitter) can be reduced. For instance, duty-cycle distortion error associated with a transmitter (e.g., a multiplexing transmitter) can be reduced. Power consumption of a transmitter (e.g., a multiplexing transmitter) can also be reduced. Moreover, increased operational speeds of a transmitter (e.g., a multiplexing transmitter) while also reducing error can be achieved.

Turning now to FIG. 1, a block diagram illustrating an example, non-limiting embodiment of a system 100 in accordance with various aspects described herein is shown. The system 100 can be a transmitter system such as, for example, a multiplexing transmitter system. In an embodiment, the system 100 can be a multiplexing transmitter system with duty-cycle distortion detection and/or a duty-cycle correction. The system 100 includes a transmitter 102. The transmitter 102 can include a multiplexer core 104 and an output buffer stage 106. The transmitter 102 can receive a set of data signals D0-D1. For example, the transmitter 102 can receive a data signal D0 and a data signal D1. However, it is to be appreciated that, in certain embodiments, the transmitter 102 can receive a different number of data signals (e.g., more than two data signals). The set of data signals D0-D1 can be, for example, a set of data streams with a defined number of bits. In an embodiment, the set of data signals D0-D1 can be a set of pseudo-random binary sequence data streams. For example, the set of data signals D0-D1 can be single-bit data streams at a particular data rate (e.g., 14 GHz for a 28 Gbps transmitter, etc.). However, it is to be appreciated that the set of data signals D0-D1 can be formatted as different types of data streams. In certain embodiments, a DIN signal generated by a serializer can be converted into the set of data signals D0-D1. The DIN signal can be, for example, a low speed parallel data stream. In an embodiment, the DIN signal can include 64 bits. As such, in a non-limiting example, a serializer that generates the DIN signal can be a 64:4 serializer. However, it is to be appreciated that, in certain embodiments, the DIN signal associated with the set of data signals D0-D1 can include another number of bits. Furthermore, it is to be appreciated that, in certain embodiments, a serializer that generates the DIN signal can be a different type of serializer. In an embodiment, a serializer can sample the DIN signal at a particular sample rate to generate the set of data signals D0-D1. In an aspect, the set of data signals D0-D1 can be a defined bit pattern. For example, the set of data signals D0-D1 can be a two-bit defined bit pattern such as "00", "01", "10", "11", etc. In certain embodiments, a value of the set of data signals D0-D1 can depend on a type of calibration mode being implemented by the transmitter 102.

The multiplexer core 104 of the transmitter 102 can convert the set of data signals D0-D1 into a first output data stream DOUTP (e.g., DOUTP shown in FIG. 1) and a second output data stream DOUTM (e.g., DOUTM shown in FIG. 1). In an aspect, the first output data stream DOUTP can be phase inverted with respect to the second output data stream DOUTM. In another aspect, the first output data stream DOUTP and second output data stream DOUTM can be differential output of the multiplexer core 104. The multiplexer core 104 can be, for example, a complementary metal-oxide-semiconductor (CMOS) multiplexer. For example, the multiplexer core 104 can be a CMOS full-rate multiplexer. In another example, the multiplexer core 104 can be a CMOS half-rate multiplexer. In yet another example, the multiplexer core 104 can be a CMOS quarter-rate multiplexer. In a non-limiting example, the multiplexer core 104 can correspond to a 2:1 multiplexer. The output buffer stage 106 of the transmitter 102 can process the first output data stream DOUTP and the second output data stream DOUTM for transmission. The output buffer stage 106 can be, for example, a driver stage for the transmitter 102. For instance, the output buffer stage 106 can drive the first output data stream DOUTP and the second output data stream DOUTM. The output buffer stage 106 can be, for example, a differential circuit with differential input and differential output. In an aspect, the output buffer stage 106 can increase power of the first output data stream DOUTP and the second output data stream DOUTM without altering a value of the first output data stream DOUTP and the second output data stream DOUTM. In one example, the first output data stream DOUTP can be a first data stream at 10 Gb/s and the second output data stream DOUTM can be a second data stream at 10 Gb/s. Furthermore, the first output data stream DOUTP and the second output data stream DOUTM can be different data signals. However, it is to be appreciated that the first output data stream DOUTP and/or the second output data stream DOUTM can be a different type of data signal.

The system 100 also includes a duty-cycle distortion (DCD) detector circuit 108 and/or a digital logic circuit 110. The DCD detector circuit 108 can be employed to compensate for DCD errors associated with the transmitter 102. For instance, the DCD detector circuit 108 can monitor output of the transmitter 102 to determine DCD error associated with the transmitter 102. In an embodiment, the DCD detector circuit 108 can be a fully differential DCD detector circuit. For instance, the DCD detector circuit 108 can monitor differential output of the transmitter 102 to determine DCD error associated with the transmitter 102. In an aspect, the DCD detector circuit 108 can monitor a difference between the first output data stream DOUTP and the second output data stream DOUTM. In another embodiment, the DCD detector circuit 108 can determine duty-cycle distortion error associated with output of the transmitter 102 to generate a DCD error code (e.g., DCD ERROR CODE shown in FIG. 1). For example, the DCD detector circuit 108 can determine duty-cycle distortion error associated with the first output data stream DOUTP and/or the second output data stream DOUTM to generate the DCD error code. The duty-cycle distortion error can be, for example, a degree of variance in timing with respect to a particular duty-cycle value (e.g., a 50% duty-cycle value). Additionally or alternatively, the duty-cycle distortion error can be, for example, a degree of variance in average voltage offset associated with output of the transmitter 102. Additionally or alternatively, the duty-cycle distortion error can be, for example, a degree of propagation delay difference between low-to-high and high-to-low transitions of the output of the transmitter 102. In an aspect, the DCD detector circuit 108 can determine the duty-cycle distortion error associated with the transmitter 102 based on a clock pattern for the first output data stream DOUTP and/or a clock pattern for the second output data stream DOUTM generated by the transmitter 102 in response to a defined bit pattern associated with the set of data signals D0-D1. In an aspect, the DCD detector circuit 108 can receive the first output data stream DOUTP and the second output data stream DOUTM. Furthermore, the DCD detector circuit 108 can measure duty-cycle distortion error of the first output data stream DOUTP and/or the second output data stream DOUTM.

In an embodiment, the DCD detector circuit 108 can measure duty-cycle distortion error associated with the first output data stream DOUTP and/or the second output data stream DOUTM using a comparator. For example, the DCD detector circuit 108 can compare the first output data stream DOUTP and the second output data stream DOUTM. In certain embodiments, the comparator of the DCD detector circuit 108 can determine whether an average value between the first output data stream DOUTP and the second output data stream DOUTM is positive or negative. Additionally, in certain embodiments, output of the comparator of the DCD detector circuit 108 can be accumulated to obtain the DCD error code. In one example, the DCD detector circuit 108 can employ an accumulator (e.g., equivalent to a linear search) to accumulate output of the comparator of the DCD detector circuit 108. In another example, the DCD detector circuit 108 can employ a successive approximation register (e.g., equivalent to a binary search) to accumulate output of the comparator of the DCD detector circuit 108. However, it is to be appreciated that a different type of technique can be employed by the DCD detector circuit 108 to accumulate output of the comparator of the DCD detector circuit 108. In another aspect, the DCD detector circuit 108 can generate the DCD error code. The DCD error code can be, for example, duty-cycle distortion output. Furthermore, the DCD error code can include a result of the duty-cycle distortion error associated with the first output data stream DOUTP and/or the second output data stream DOUTM. For example, the DCD error code can indicate a type of distortion error associated with the first output data stream DOUTP and/or the second output data stream DOUTM. In certain embodiments, the DCD error code can be formatted as an N-bit word, where N is an integer.

The digital logic circuit 110 can receive the DCD error code generated by the DCD detector circuit 108. In an aspect, the digital logic circuit 110 can monitor the digital code generated by the DCD detector circuit 108. For example, the digital logic circuit 110 can repeatedly monitor (e.g., periodically monitor) the digital code generated by the DCD detector circuit 108. Furthermore, the digital logic circuit 110 can generate an N-bit pattern (e.g., N-BIT PATTERN shown in FIG. 1) based on the DCD error code. The N-bit pattern can be, for example, an N-bit code to facilitate control of a duty-cycle of a clock employed by the transmitter 102. For instance, the N-bit pattern can be a digital code with N bits. In an implementation, the digital logic circuit 110 can be a finite state machine. Furthermore, the digital logic circuit 110 can be implemented by hardware and/or firmware. In an embodiment, the N-bit pattern can be provided to a digital-to-analog converter (DAC) 112. In an aspect, the N-bit pattern can control current steering of the DAC 112 to facilitate a duty-cycle of a clock associated with the transmitter. Accordingly, the DAC 112 can digitally control a duty-cycle of a clock provided to the transmitter 102.

In another aspect, the DAC 112 can generate an offset value (e.g., OFFSET VALUE shown in FIG. 1) for a duty-cycle correction circuit 114 based on the N-bit pattern. The offset value can be a current value and/or a voltage value to perform duty-cycle correction (e.g., duty-cycle distortion correction) associated with the transmitter 102. For example, a duty-cycle correction circuit 114 can receive the offset value. Furthermore, the duty-cycle correction circuit 114 can correct duty-cycle distortion associated with the first output data stream DOUTP and/or the second output data stream DOUTM based on the offset value. In an embodiment, the DAC 112 can generate the offset value for an amplifier 116 of the duty-cycle correction circuit 114 based on the N-bit pattern. In yet another aspect, the DAC 112 can generate the offset value to nullify the duty-cycle distortion error associated with output of the transmitter 102. For instance, the DAC 112 can generate the offset value to nullify the duty-cycle distortion error associated with the first output data stream DOUTP and/or the second output data stream DOUTM. In certain embodiments, the DAC 112 can be employed to supply a portion of a bias current (e.g., via the offset value) for a pair of transistors (e.g., an input differential pair of transistors) of the amplifier 116. In certain embodiments, the pair of transistors of the amplifier 116 can be PMOS transistor input version. Additionally or alternatively, in certain embodiments, the DAC 112 can be a sinking NMOS transistor current-steering DAC. In certain embodiments, the amplifier 116 can include load PMOS current source devices split into two or more switchable devices by connecting gates to either bias voltage or supply rail to turn off respective switchable devices. Additionally or alternatively, current sources of the amplifier 116 can be adjusted in differential fashion to create an offset for the amplifier 116.

In an embodiment, the duty-cycle correction circuit 114 can adjust an input clock (e.g., INPUT CLOCK shown in FIG. 1) associated with the transmitter 102 based on the offset value and/or the N-bit pattern. In certain embodiments, the input clock can include an in-phase clock and/or a quadrature clock. As such, in certain embodiments, the duty-cycle correction circuit 114 can adjust an in-phase clock and/or a quadrature clock associated with the transmitter 102 based on the offset value and/or the N-bit pattern. In certain embodiments, the input clock can be processed by a current mode logic (CML) buffer 118 to facilitate transmission of the input clock to the duty-cycle correction circuit 114. For example, the CML buffer 118 can be a driver to facilitate propagation of the input clock to the duty-cycle correction circuit 114. In an aspect, the duty-cycle correction circuit 114 can adjust the input clock associated with the transmitter 102 based on an amount of duty-cycle distortion error indicated by the offset value and/or the N-bit pattern. As such, based on the offset value and/or the N-bit pattern, one or more clocks (e.g., CKOUTP and/or CKOUTM shown in FIG. 1) provided to the multiplexer core 104 of the transmitter 102 can be modified.

In certain embodiments, the one or more clocks (e.g., CKOUTP and/or CKOUTM) can be digitally delayed via a clock buffer 120 associated with the duty-cycle correction circuit 114 to manage a rise time and/or a fall time for the one or more clocks (e.g., CKOUTP and/or CKOUTM) provided to the multiplexer core 104 of the transmitter 102. In certain embodiments, the one or more clocks (e.g., CKOUTP and/or CKOUTM) can control one or more transmission gates of the multiplexer core 104. As such, a duty-cycle of the one or more clocks (e.g., CKOUTP and/or CKOUTM) provided to the multiplexer core 104 of the transmitter 102 can be digitally controlled based on the DCD error code, the N-bit pattern and/or the offset value associated with the duty-cycle distortion error. Moreover, the duty-cycle correction circuit 114 can adjust the one or more clocks (e.g., CKOUTP and/or CKOUTM) associated with the transmitter 102. Furthermore, the DCD detector circuit 108 can facilitate digital control of a duty-cycle of the one or more clocks (e.g., CKOUTP and/or CKOUTM) managed by the duty-cycle correction circuit 114 based on duty-cycle distortion error associated with output (e.g., the first output data stream DOUTP and/or the second output data stream DOUTM) of the transmitter 102. In certain embodiments, the DCD detector circuit 108 can measure first duty-cycle distortion error associated with the first output data stream DOUTP and second duty-cycle distortion error associated with the second output data stream DOUTM. Furthermore, the DCD detector circuit 108 can compare the first output data stream DOUTP (e.g., the first duty-cycle distortion error associated with the first output data stream DOUTP) and the second output data stream DOUTM (e.g., second duty-cycle distortion error associated with the second output data stream DOUTM) to facilitate generation of a digital code associated with the duty-cycle distortion error. For instance, the DCD detector circuit 108 can facilitate digital control of a duty-cycle of the one or more clocks (e.g., CKOUTP and/or CKOUTM) managed by the duty-cycle correction circuit 114 based on the comparison of the first output data stream DOUTP (e.g., the first duty-cycle distortion error associated with the first output data stream DOUTP) and the second output data stream DOUTM (e.g., second duty-cycle distortion error associated with the second output data stream DOUTM).

In certain embodiments, aspects of the DCD detector circuit 108 and/or the digital logic circuit 110 can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described. For example, the DCD detector circuit 108 and/or the digital logic circuit 110 can include and/or can be in communication with a memory for storing computer executable components and instructions. Furthermore, the DCD detector circuit 108 and/or the digital logic circuit 110 can include and/or can be in communication with a processor to facilitate operation of the instructions (e.g., computer executable components and instructions) by the system.

Figure 2:
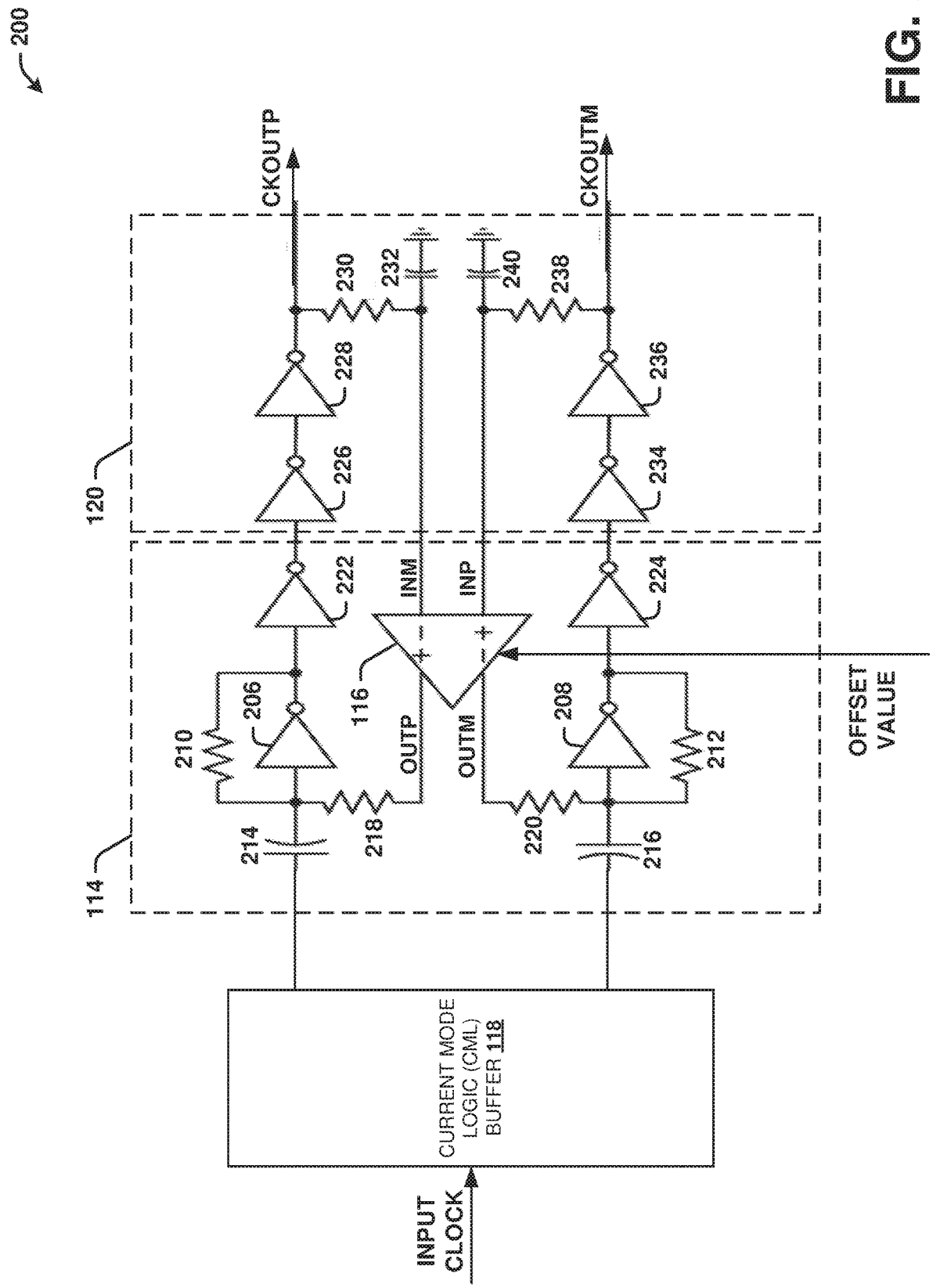
FIG. 2 illustrates an example, non-limiting embodiment of a duty-cycle correction circuit and a clock buffer in accordance with various aspects described herein.

Referring now to FIG. 2, a block diagram illustrating an example, non-limiting embodiment of a system 200 in accordance with various aspects described herein is shown. The system 200 includes the duty-cycle correction circuit 114, the clock buffer 120 and the CML buffer 118. The CML buffer 118 can receive the input clock. In certain embodiments, the input clock can be processed by the CML buffer 118 to manage a rise time and/or a fall time for the input clock. The duty-cycle correction circuit 114 can include the amplifier 116. The duty-cycle correction circuit 114 can also include an inverter 206 and an inverter 208. In an embodiment, the inverter 206 can employ resistive feedback via a resistor 210 to convert the input clock to a first CMOS clock CKOUTP (e.g., CKOUTP shown in FIG. 2) for the transmitter 102. Additionally, the inverter 208 can employ resistive feedback via a resistor 212 to convert the modified I_CLK (e.g., a current mode logic input clock) to a second CMOS clock CKOUTM (e.g., CKOUTM shown in FIG. 2) for the transmitter 102. The first CMOS clock CKOUTP and the second CMOS clock CKOUTM can be, for example, the one or more clocks provided to the multiplexer core 104 of the transmitter 102.

In certain embodiments, the duty-cycle correction circuit 114 can also include a capacitor 214 and/or a capacitor 216. The capacitor 214 can be electrically coupled to the CML buffer 118. Furthermore, the capacitor 214 can be electrically coupled to the inverter 206, the resistor 210 and a resistor 218. The resistor 218 can also be electrically coupled to the amplifier 116. For example, the resistor 218 can be electrically coupled to a positive terminal of the amplifier 116. The capacitor 216 can be electrically coupled to the CML buffer 118. Furthermore, the capacitor 216 can be electrically coupled to the inverter 208, the resistor 212 and a resistor 220. The resistor 220 can also be electrically coupled to the amplifier 116. For example, the resistor 220 can be electrically coupled to a negative terminal of the amplifier 116. In an embodiment, a duty-cycle for the first CMOS clock CKOUTP and/or the second CMOS clock CKOUTM can depend on a value of the offset value.

In certain embodiments, the duty-cycle correction circuit 114 can also include an inverter 222 and/or an inverter 224. The inverter 222 can be configured to perform logical negation with respect to a data signal (e.g., an inverted version of the input clock) received from the inverter 206. For instance, the inverter 222 can be configured as a NOT logic gate that inverts an inverted version of the input clock to provide the first CMOS clock CKOUTP. Furthermore, the inverter 224 can be configured to perform logical negation with respect to a data signal (e.g., an inverted version of the input clock) received from the inverter 208. For instance, the inverter 224 can be configured as a NOT logic gate that inverts an inverted version of the input clock to provide the second CMOS clock CKOUTM. In an aspect, the offset value can be provided to the amplifier 116. For example, the offset value can be provided to the amplifier 116 to control one or gates of one or more transistors of the amplifier 116. Furthermore, the offset value can be provided to the amplifier 116 to modify a duty-cycle of the first CMOS clock CKOUTP and/or the second CMOS clock CKOUTM. In certain embodiments, the clock buffer 120 can include an inverter 226, an inverter 228, a resistor 230 and/or a capacitor 232 to manage (e.g., alter) a rise time and/or a fall time for the first CMOS clock CKOUTP. Additionally, the clock buffer 120 can include an inverter 234, an inverter 236, a resistor 238 and/or a capacitor 240 to manage (e.g., alter) a rise time and/or a fall time for the second CMOS clock CKOUTM. In an embodiment, an RC filter formed by the resistor 230 and the capacitor 232 can transform the first CMOS clock CKOUTP into a voltage value INM. Additionally, an RC filter formed by the resistor 238 and the capacitor 240 can transform the second CMOS clock CKOUTM into a voltage value INP. The voltage value INM and the voltage value INP can be provided as input to the amplifier 116. In an aspect, the voltage value INM can be provided to a negative terminal of the amplifier 116 and the voltage value INP can be provided to a positive terminal of the amplifier 116. In certain embodiments, the amplifier 116 can provide a voltage value OUTP and a voltage value OUTM. For example, output of the amplifier can include the voltage value OUTP (e.g., provided via a positive terminal of the amplifier 116) and the voltage value OUTM (e.g., provided via a negative terminal of the amplifier 116).

Figure 3:
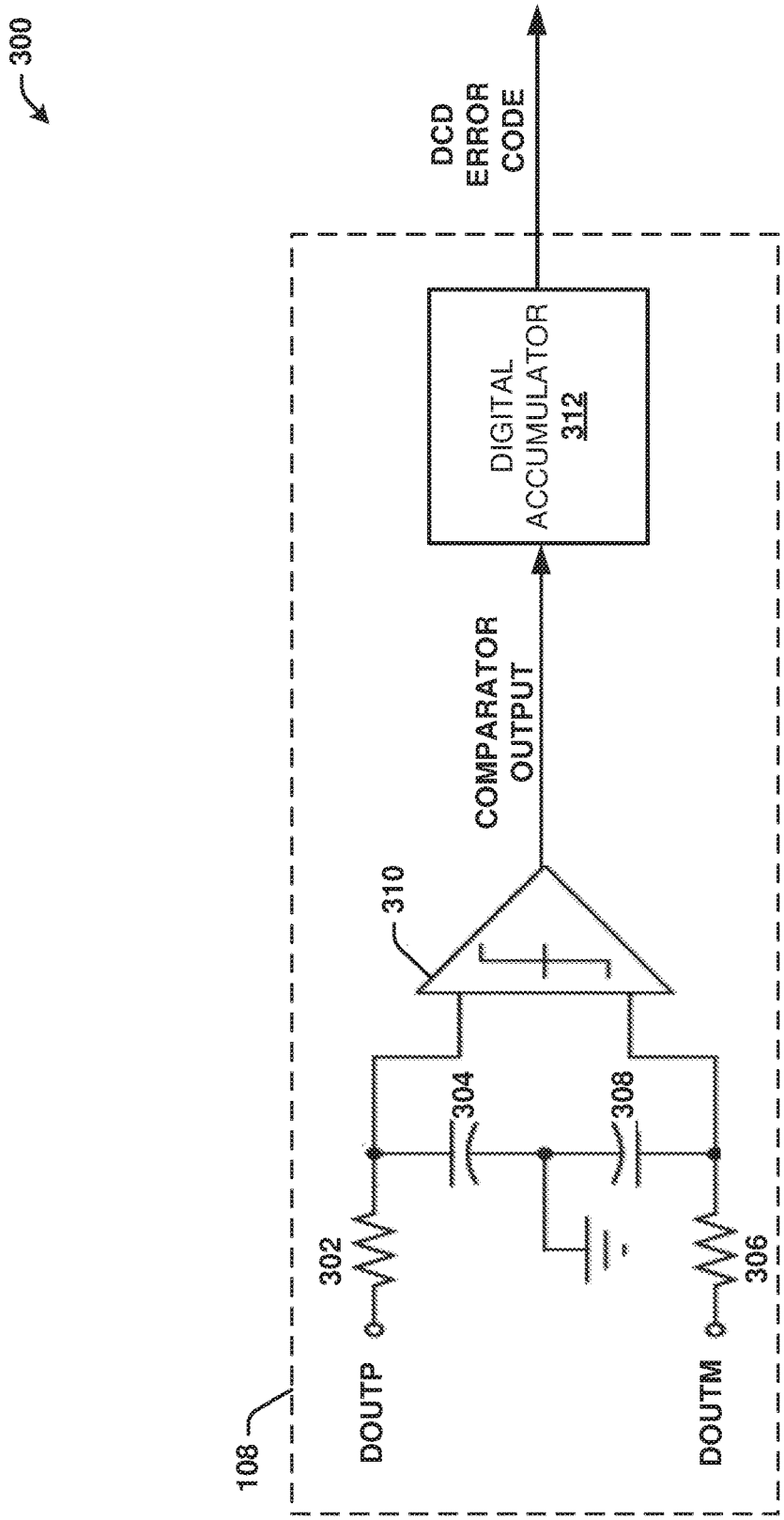
FIG. 3 illustrates an example, non-limiting embodiment of a duty-cycle distortion detector circuit in accordance with various aspects described herein.

Referring now to FIG. 3, a block diagram illustrating an example, non-limiting embodiment of a system 300 in accordance with various aspects described herein is shown. The system 300 includes the DCD detector circuit 108. The DCD detector circuit 108 can include a resistor 302, a capacitor 304, a resistor 306, a capacitor 308, a comparator 310 and/or a digital accumulator 312. The resistor 302 and the capacitor 304 can correspond to a first RC filter. Furthermore, the resistor 306 and the capacitor 308 can correspond to a second RC filter. In an aspect, the first output data stream DOUTP can be provided to the resistor 302. Furthermore, the resistor 302 can be electrically coupled to the capacitor 304 and the comparator 310. The second output data stream DOUTM can be provided to the resistor 306. Furthermore, the resistor 306 can be electrically coupled to the capacitor 308 and the comparator 310. The capacitor 304 can also be electrically coupled to the capacitor 308 and electrical ground.

The comparator 310 can compare the first output data stream DOUTP (e.g., the first output data stream DOUTP processed by the first RC filter associated with the resistor 302 and the capacitor 304) and the second output data stream DOUTM (e.g., the second output data stream DOUTM processed by the second RC filter associated with the resistor 306 and the capacitor 308). In an aspect, the first RC filter associated with the resistor 302 and the capacitor 304 can generate an average value of the first output data stream DOUTP. Furthermore, the second RC filter associated with the resistor 306 and the capacitor 308 can generate an average value of the second output data stream DOUTM. As such, in certain embodiments, the comparator 310 can compare the average value of the first output data stream DOUTP to the average value of the second output data stream DOUTM. Based on the comparison of the first output data stream DOUTP and the second output data stream DOUTM, the comparator 310 can generate comparator output (e.g., COMPARATOR OUTPUT shown in FIG. 3). For instance, the comparator output can include data indicative of the comparison of the first output data stream DOUTP and the second output data stream DOUTM. In an example, the comparator 310 can determine if a differential average between the average value of the first output data stream DOUTP to the average value of the second output data stream DOUTM is positive or negative. The comparator output can be provided to the digital accumulator 312. The digital accumulator 312 can convert the comparator output to the DCD error code. In an embodiment, the DCD error code can be an N-bit word. For example, the digital accumulator 312 can accumulate the comparator output to obtain an N-bit word associated with the DCD error code. In an embodiment, the digital accumulator 312 can employ a linear search to convert the comparator output to the DCD error code (e.g., an N-bit word associated with the DCD error code). In another embodiment, the digital accumulator 312 can be implemented as a successive approximation register that employs a binary search to convert the comparator output to the DCD error code (e.g., an N-word associated with the DCD error code).

Figure 4:
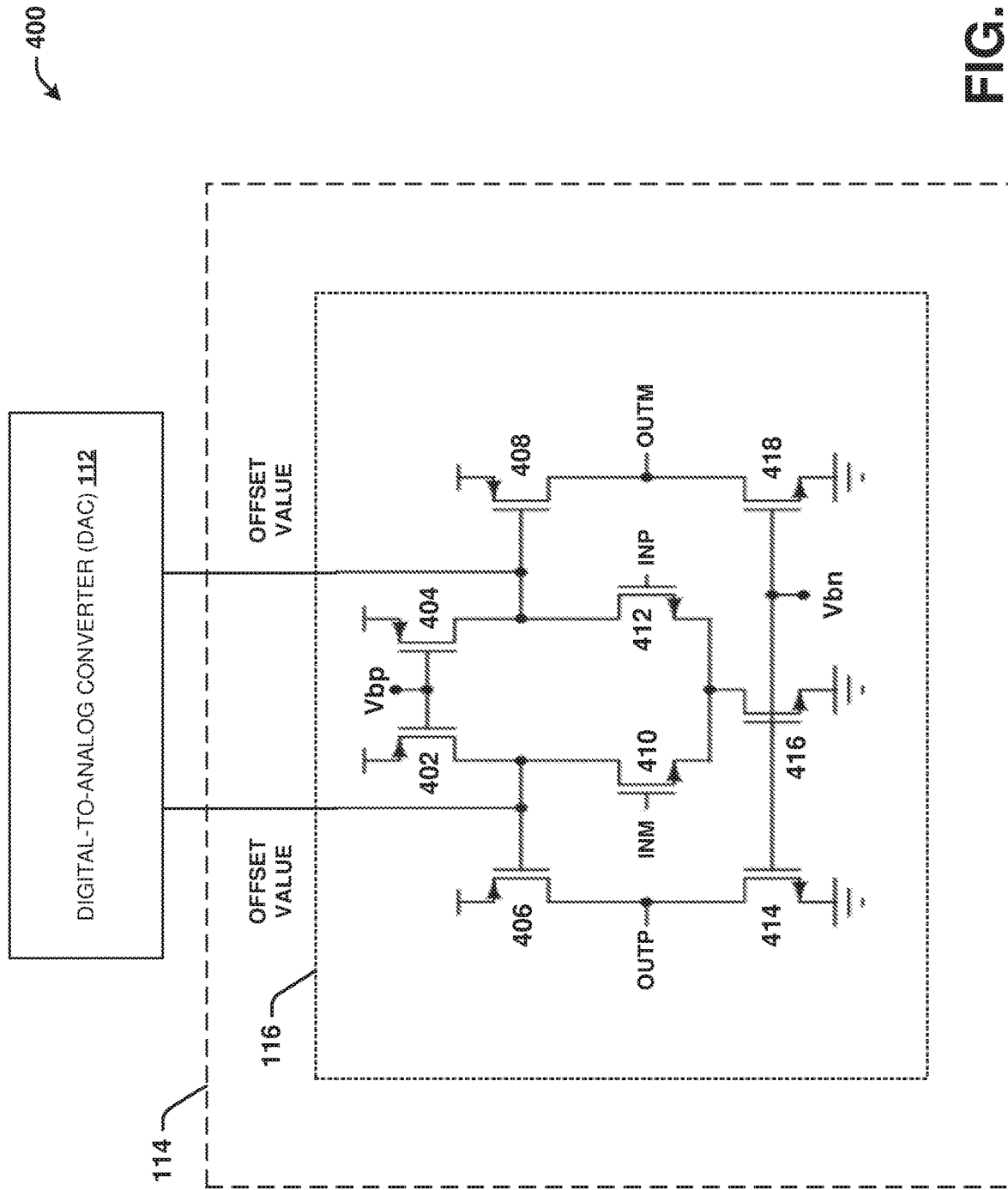
FIG. 4 illustrates an example, non-limiting embodiment of an amplifier in accordance with various aspects described herein.

Referring now to FIG. 4, a block diagram illustrating an example, non-limiting embodiment of a system 400 in accordance with various aspects described herein is shown. The system 400 includes the DAC 112 and the amplifier 116. For example, the amplifier 116 can be included in the duty-cycle correction circuit 114. It is to be appreciated that the duty-cycle correction circuit 114 can include one or more other elements besides the amplifier 116. In an embodiment, the DAC 112 can provide the offset value to the amplifier 116. The amplifier 116 can include a transistor 402 and a transistor 404 controlled by a voltage bias Vbp. For example, the transistor 402 and the transistor 404 can be a pair of transistors with a gate controlled by the voltage bias Vbp. The offset value can also be provided to a drain of the transistor 402 and a drain of the transistor 404. The amplifier 116 can include a transistor 406 and a transistor 408. For example, the transistor 406 and the transistor 408 can be a pair of transistors with a gate controlled by the offset value. Furthermore, a drain of the transistor 406 can provide the voltage value OUTP and a drain of the transistor 408 can provide the voltage value OUTM.

The amplifier 116 can also include a transistor 410 and a transistor 412. For example, the transistor 410 and the transistor 412 can be a pair of transistors with a gate controlled by the input clock. In an aspect, a gate of the transistor 410 can be controlled by the voltage value INM and a gate of the transistor 412 can be controlled by the voltage value INP. Furthermore, the offset value can be provided to a drain of the transistor 410 and a drain of the transistor 412. Furthermore, the amplifier 116 can include a transistor 414, a transistor 416 and a transistor 418. For example, the transistor 414, the transistor 416 and the transistor 418 can be a set of transistors with a gate controlled by the voltage bias Vbn. A drain of the transistor 414 can be electrically coupled to the drain of the transistor 406 to facilitate providing the voltage value OUTP. A drain of the transistor 418 can be electrically coupled to the drain of the transistor 408 to facilitate providing the voltage value OUTM. Furthermore, a drain of the transistor 416 can be electrically coupled to a source of the transistor 410 and a source of the transistor 412.

In an embodiment, the transistor 402, the transistor 404, the transistor 406, the transistor 408, the transistor 410, the transistor 412, the transistor 414, the transistor 414, and/or the transistor 416 can be a PMOS transistor. In another embodiment, the transistor 402, the transistor 404, the transistor 406, the transistor 408, the transistor 410, the transistor 412, the transistor 414, the transistor 414, and/or the transistor 416 can be a NMOS transistor. However, it is to be appreciated that the transistor 402, the transistor 404, the transistor 406, the transistor 408, the transistor 410, the transistor 412, the transistor 414, the transistor 414, and/or the transistor 416 can be a different type of transistor. In an embodiment, the transistor 402, the transistor 404, the transistor 406, the transistor 408, the transistor 410, the transistor 412, the transistor 414, the transistor 414, and/or the transistor 416 can facilitate control of a duty-cycle of the first CMOS clock CKOUTP and/or the second CMOS clock CKOUTM via the offset value provided by the DAC 112.

Figure 5:
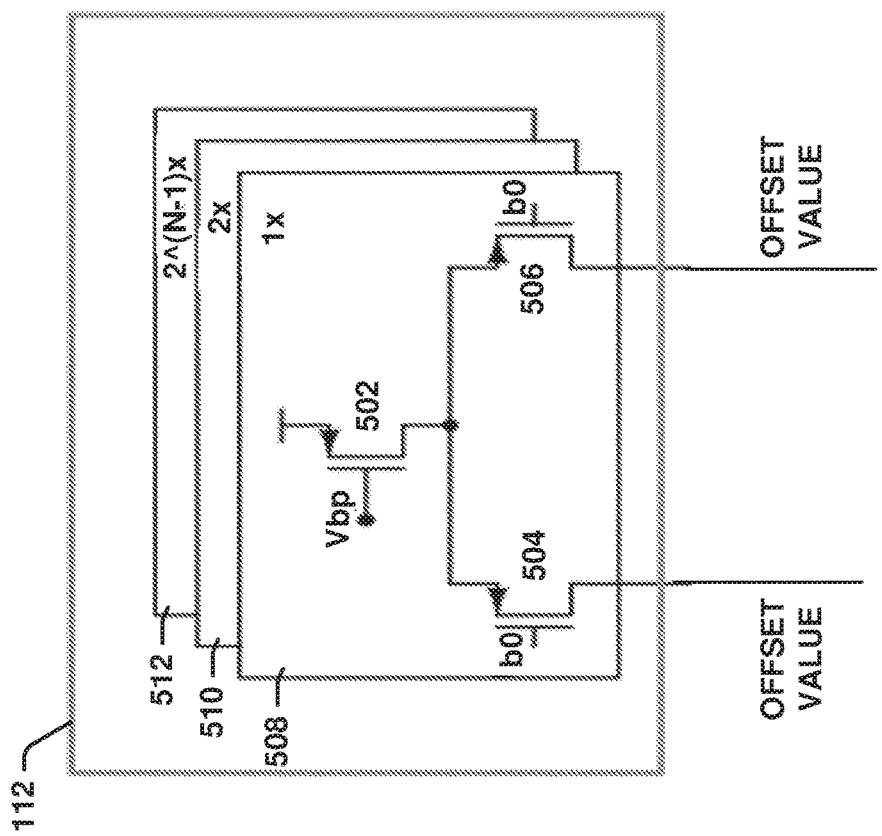
FIG. 5 illustrates an example, non-limiting embodiment of a digital-to-analog converter in accordance with various aspects described herein.

Referring now to FIG. 5, a block diagram illustrating an example, non-limiting embodiment of a system 500 in accordance with various aspects described herein is shown. The system 500 includes the DAC 112. For example, the DAC 112 can be an N-bit current steering DAC that includes a transistor 502, a transistor 504 and/or a transistor 506. A gate of the transistor 502 can be controlled by the bias voltage Vbp that also controls the gate of the transistor 402 and the transistor 404 of the amplifier 116. A drain of the transistor 502 can be electrically coupled to a source of the transistor 504 and a source of the transistor 506. A gate of the transistor 504 and/or a gate of the transistor 506 can be controlled by a bit value b0. Furthermore, a drain of the transistor 504 and/or a drain of the transistor 506 can provide the offset value for the amplifier 116. In certain embodiments, the DAC 112 can include one or more unit cells comprising a current source transistor and a differential pair of transistors. For instance, the DAC 112 can include a unit cell 508 (e.g., a unit cell 1x) that includes the transistor 502, the transistor 504 and the transistor 506. Furthermore, the DAC 112 can include a unit cell 510 (e.g., a unit cell 2x) that includes a current source transistor and a differential pair of transistors for another bit value, a unit cell 512 (e.g., a unit cell 2^(N−1)x) that includes a current source transistor and a differential pair of transistors for yet another bit value, etc.

Figure 6:
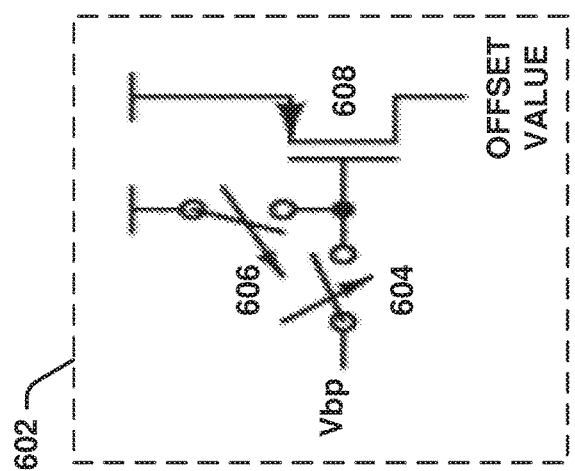
FIG. 6 illustrates an example, non-limiting embodiment of a portion of an amplifier in accordance with various aspects described herein.

Referring now to FIG. 6, a block diagram illustrating an example, non-limiting embodiment of a system 600 in accordance with various aspects described herein is shown. The system 600 includes a current source device 602. The current source device 602 can correspond to the transistor 402 and/or the transistor 404 of the amplifier 116. In an embodiment, the current source device 602 can be a load PMOS current source device. The current source device 602 can include a switchable device 604 and/or a switchable device 606. The current source device 602 can also include a transistor 608. The switchable device 604 and/or the switchable device 606 can be configured to be in a first state to provide the bias voltage Vbp to a gate of the transistor 608 or in a second state to provide a supply rail to turn off the gate of the transistor 608. Furthermore, the offset value can be provided to the drain of the transistor 608.

Figure 7:
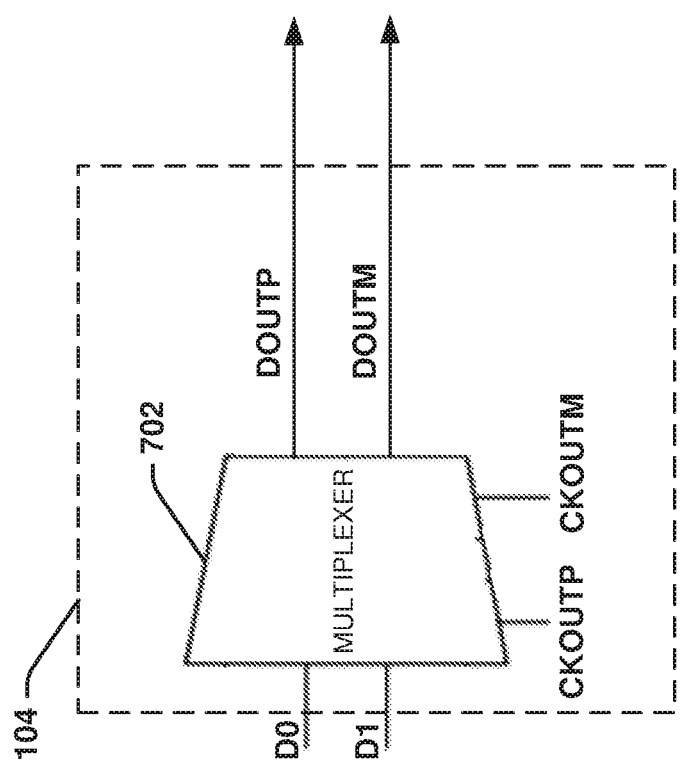
FIG. 7 illustrates an example, non-limiting embodiment of a multiplexer core in accordance with various aspects described herein.

Referring now to FIG. 7, a block diagram illustrating an example, non-limiting embodiment of a system 700 in accordance with various aspects described herein is shown. The system 700 includes the multiplexer core 104. The multiplexer core 104 can include a multiplexer 702. The multiplexer 702 can receive the set of data signals D0-D1. Additionally, the multiplexer 702 can receive the first CMOS clock CKOUTP and the second CMOS clock CKOUTM. For example, the set of data signals D0-D1 can include a data signal D0 and a data signal D1. The set of data signals D0-D1 can be, for example, a set of data streams with a defined number of bits. In one example, the set of data signals D0-D1 can be a set of pseudo-random binary sequence data streams. For instance, the set of data signals D0-D1 can be single-bit data streams at a particular data rate (e.g., 14 GHz for a 28 Gbps transmitter, etc.). The multiplexer 702 can multiplex the set of data signals D0-D1 into the first output data stream DOUTP. Furthermore, the multiplexer 702 can multiplex the set of data signals D0-D1 into the second output data stream DOUTM. In an embodiment, the set of data signals D0-D1 can be a defined bit pattern. For example, the set of data signals D0-D1 can be a four-bit defined bit pattern such as "00", "01", "10", "11", etc. In an embodiment, a value for the set of data signals D0-D1 can depend on a type of calibration mode being performed by the transmitter 102.

Figure 8:
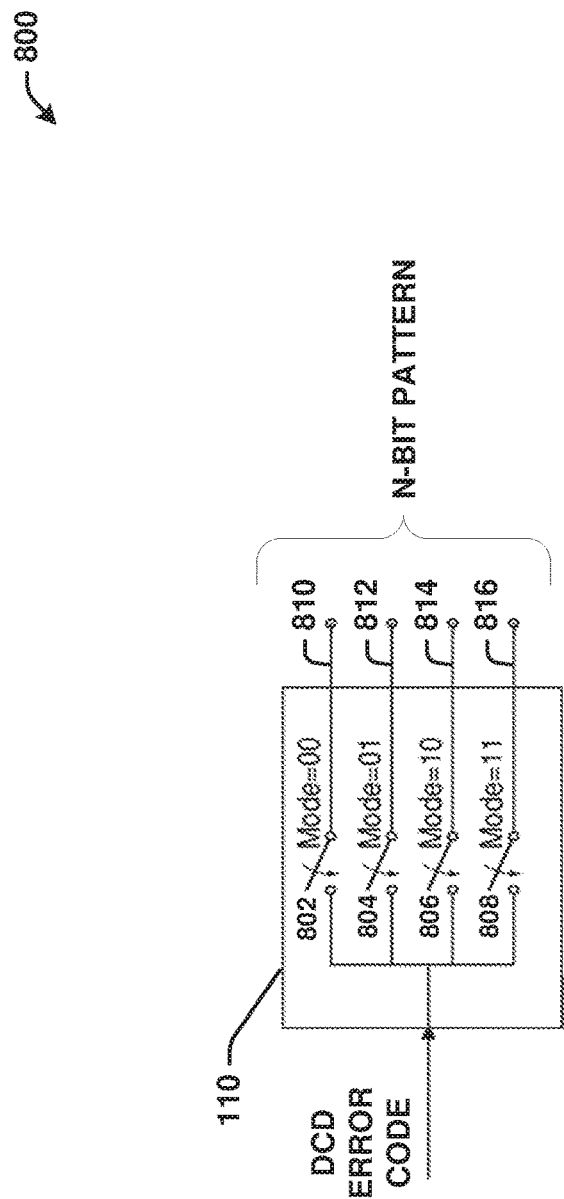
FIG. 8 illustrates an example, non-limiting embodiment of a digital logic circuit in accordance with various aspects described herein.

Referring now to FIG. 8, a block diagram illustrating an example, non-limiting embodiment of a system 800 in accordance with various aspects described herein is shown. The system 800 includes the digital logic circuit 110. The digital logic circuit 110 can include a switch 802, a switch 804, a switch 806 and a switch 808. The digital logic circuit 110 can receive the DCD error code generated by the DCD detector circuit 108. For example, the digital logic circuit 110 can receive an N-bit word associated with the DCD error code generated by the DCD detector circuit 108. Based on the DCD error code, the digital logic circuit 110 can generate the N-bit pattern provided to the DAC 112. For instance, based on the DCD error code, the digital logic circuit 110 can configure the switch 802, the switch 804, the switch 806 and the switch 808 to generate the N-bit pattern provided to the DAC 112. In an aspect, the digital logic circuit 110 can open or close the switch 802, open or close the switch 804, open or close the switch 806, and open or close the switch 808 based on the DCD error code. In another aspect, the digital logic circuit 110 can be a demultiplexer that connects input associated with the DCD error code to one of the outputs associated with the N-bit pattern based on a mode of operation for the DAC 112. For example, output 810 of the digital logic circuit 110 that is associated with the DCD error code (e.g., an N-bit word provided by the DCD error code) can be provided to the DAC 112 during a first mode of operation (e.g., Mode=00), output 812 of the digital logic circuit 110 that is associated with the DCD error code (e.g., an N-bit word provided by the DCD error code) can be provided to the DAC 112 during a second mode of operation (e.g., Mode=01), output 814 of the digital logic circuit 110 that is associated with the DCD error code (e.g., an N-bit word provided by the DCD error code) can be provided to the DAC 112 during a third mode of operation (e.g., Mode=10), and output 616 of the digital logic circuit 110 that is associated with the DCD error code (e.g., an N-bit word provided by the DCD error code) can be provided to the DAC 112 during a fourth mode of operation (e.g., Mode=11).

In certain embodiments, aspects of the systems, apparatuses or processes explained in this disclosure (e.g., aspects of the system 100, the system 200, the system 300, the system 400, the system 500, the system 600, the system 700 and/or the system 800) can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described. For example, a system (e.g., the system 100, the system 200, the system 300, the system 400, the system 500, the system 600, the system 700 and/or the system 800) can include a memory for storing computer executable components and instructions. Furthermore, the system (e.g., the system 100, the system 200, the system 300, the system 400, the system 500, the system 600, the system 700 and/or the system 800) can include a processor to facilitate operation of the instructions (e.g., computer executable components and instructions) by the system.

Figure 9:
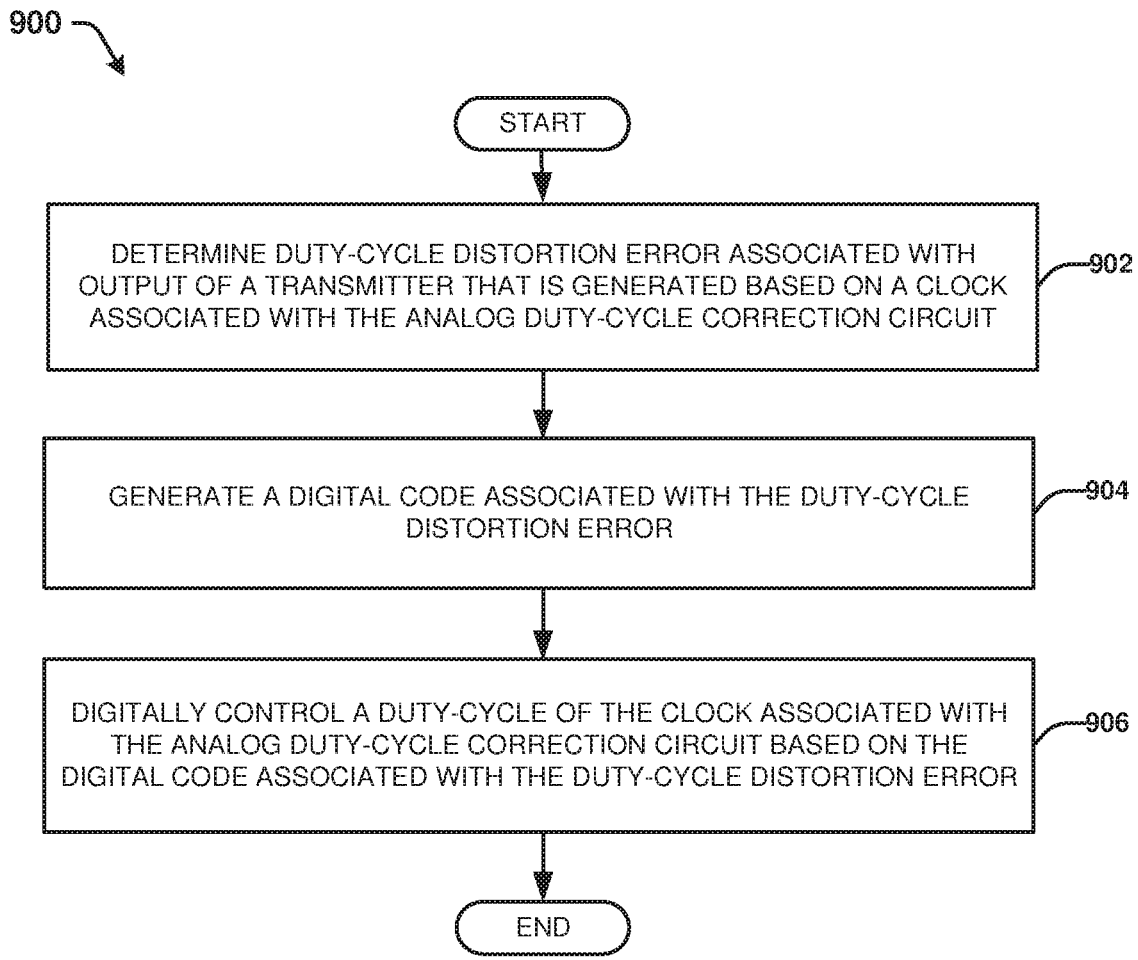
FIG. 9 illustrates a flow diagram of an example, non-limiting embodiment of a method for reducing error associated with a transmitter.
Figure 10:
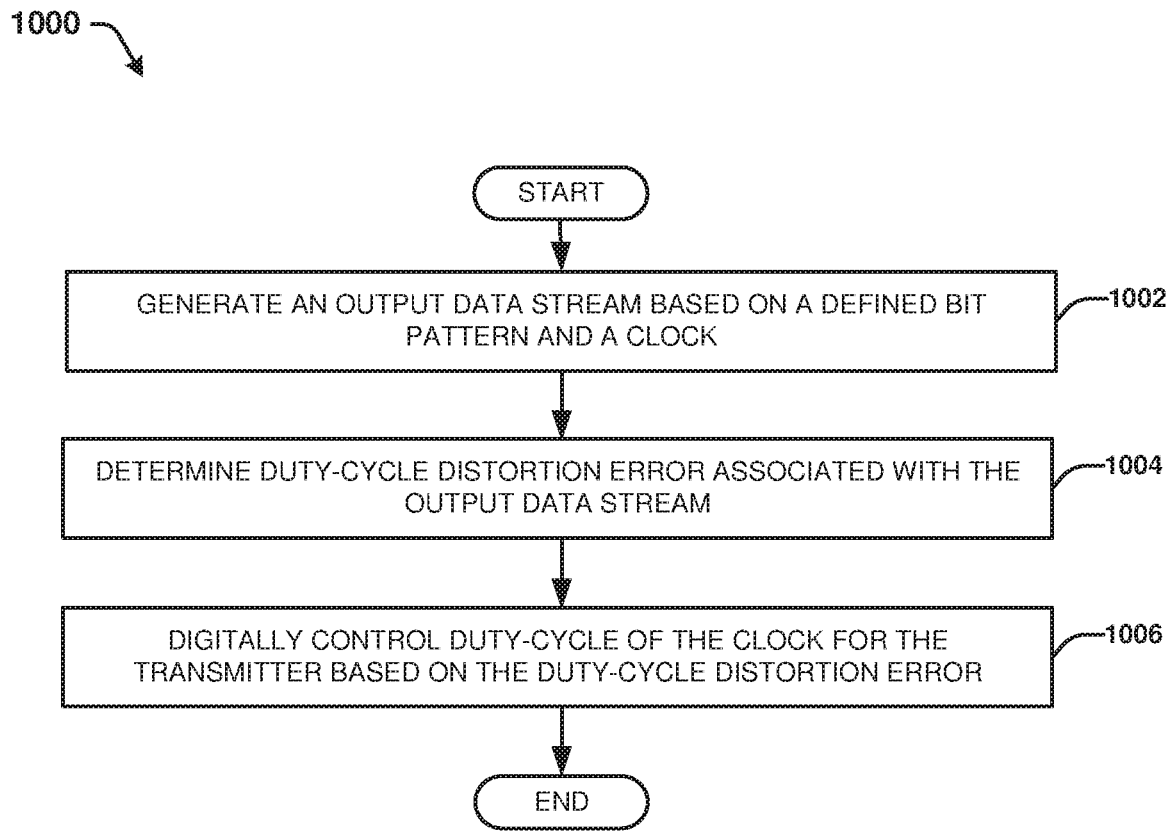
FIG. 10 illustrates a flow diagram of an example, non-limiting embodiment of a method for reducing error associated with a transmitter.

In view of the example systems described above, methods that may be implemented in accordance with the described subject matter may be better appreciated with reference to the flow charts of FIG. 9 and FIG. 10. While for purposes of simplicity of explanation, the methods are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described hereinafter.

Referring to FIG. 9, a flow diagram of an example, non-limiting embodiment of a method 900 for reducing error associated with a transmitter is shown. Method 900 can begin at block 902, where duty-cycle distortion error associated with output of a transmitter, that is generated based on a clock associated with the analog duty-cycle correction circuit, is determined (e.g., by the DCD detector circuit 108). For example, the analog duty-cycle correction circuit can provide the clock to the transmitter. Furthermore, the transmitter can generate output (e.g., one or more output data streams) based on the clock. The duty-cycle distortion error can be, for example, a degree of variance in timing with respect to a particular duty-cycle value (e.g., a 50% duty-cycle value). Additionally or alternatively, the duty-cycle distortion error can be, for example, a degree of variance in average voltage offset associated with output of the transmitter. Additionally or alternatively, the duty-cycle distortion error can be, for example, a degree of propagation delay difference between low-to-high and high-to-low transitions of the output of the transmitter. In an embodiment, the duty-cycle distortion error can be measured using a comparator. For example, a first output data stream of the transmitter and a second output data stream can be compared. In certain embodiments, a successive approximation register can be employed to determine the duty-cycle distortion error. In certain embodiments, an accumulator can be employed to determine the duty-cycle distortion error.

At block 904, a digital code associated with the duty-cycle distortion error is generated (e.g., by the DCD detector circuit 108). For example, a DCD error code associated with the duty-cycle distortion error can be generated. The digital code can be, for example, duty-cycle distortion output. Furthermore, the digital code can include a result of the duty-cycle distortion error associated with the output of the transmitter. For instance, the digital code can indicate a type of distortion error associated with the output. In certain embodiments, the digital code can be formatted as an N-bit word. In certain embodiments, a defined bit pattern associated with the digital code can be generated. The defined bit pattern can be, for example, an N-bit pattern associated with the duty-cycle distortion error. Furthermore, the defined bit pattern can be an N-bit code to facilitate control of a duty-cycle of the clock. In certain embodiments, the defined bit pattern can be generated by a finite state machine based on the digital code.

At block 906, a duty-cycle of the clock associated with the analog duty-cycle correction circuit is digitally controlled (e.g., by the digital logic circuit 110 and/or the DAC 112) based on the digital code associated with the duty-cycle distortion error. For example, a DAC can receive the digital code and/or a defined bit pattern associated with the digital code. The DAC can, for example, generate an offset value for an amplifier of the analog duty-cycle correction circuit based on the digital code and/or a defined bit pattern associated with the digital code. In an aspect, the DAC can generate the offset value to nullify the duty-cycle distortion error associated with output of the transmitter. In certain embodiments, the DAC can be employed to supply a portion of a bias current (e.g., via the offset value) for a pair of transistors (e.g., an input differential pair of transistors) of the amplifier of the analog duty-cycle correction circuit. In certain embodiments, the pair of transistors of the amplifier of the analog duty-cycle correction circuit can be PMOS transistor input version. Additionally or alternatively, in certain embodiments, the DAC can be a sinking NMOS transistor current-steering DAC. In certain embodiments, the amplifier of the analog duty-cycle correction circuit can include load PMOS current source devices split into two or more switchable devices by connecting gates to either bias voltage or supply rail to turn off respective switchable devices. Additionally or alternatively, current sources of the amplifier of the analog duty-cycle correction circuit can be adjusted in differential fashion to create an offset for the amplifier.

Referring to FIG. 10, a flow diagram of an example, non-limiting embodiment of a method 1000 for reducing error associated with a transmitter is shown. Method 1000 can begin at block 1002, an output data stream is generated (e.g., by the transmitter 102) based on a defined bit pattern and a clock. For instance, a transmitter can generate the output data stream based on a defined bit pattern and a clock. In certain embodiments, the defined bit pattern can be provided to the transmitter during a calibration mode for the transmitter. The transmitter can include, for example, a multiplexer core that receives the defined bit pattern. In certain embodiments, the transmitter can receive the defined bit pattern via a set of data signals. Furthermore, in an embodiment, the transmitter can receive the clock from a duty-cycle correction circuit (e.g., an analog duty-cycle correction circuit).

At block 1004, duty-cycle distortion error associated with the output data stream is determined (e.g., by the DCD detector circuit 108). The duty-cycle distortion error can be, for example, a degree of variance in timing with respect to a particular duty-cycle value (e.g., a 50% duty-cycle value). Additionally or alternatively, the duty-cycle distortion error can be, for example, a degree of variance in average voltage offset associated with output of the transmitter. Additionally or alternatively, the duty-cycle distortion error can be, for example, a degree of propagation delay difference between low-to-high and high-to-low transitions of the output of the transmitter. In an embodiment, the duty-cycle distortion error can be measured using a comparator. For example, a first output data stream of the transmitter and a second output data stream can be compared. In certain embodiments, a successive approximation register can be employed to determine the duty-cycle distortion error. In certain embodiments, an accumulator can be employed to determine the duty-cycle distortion error. Additionally, in certain embodiments, a digital code associated with the duty-cycle distortion error can be generated. For example, a DCD error code associated with the duty-cycle distortion error can be generated. The digital code can be, for example, duty-cycle distortion output. Furthermore, the digital code can include a result of the duty-cycle distortion error associated with the output of the transmitter. For instance, the digital code can indicate a type of distortion error associated with the output. In certain embodiments, the digital code can be formatted as an N-bit word. In certain embodiments, a defined bit pattern associated with the digital code can be generated. The defined bit pattern can be, for example, an N-bit pattern associated with the duty-cycle distortion error. Furthermore, the defined bit pattern can be an N-bit code to facilitate control of a duty-cycle of the clock. In certain embodiments, the defined bit pattern can be generated by a finite state machine based on the digital code.

At block 1006, duty-cycle of the clock for the transmitter is digitally controlled (e.g., by the digital logic circuit 110 and/or the DAC 112) based on the duty-cycle distortion error. For example, a DAC can receive the digital code and/or a defined bit pattern associated with the digital code. The DAC can, for example, generate an offset value for an amplifier of the analog duty-cycle correction circuit based on the digital code and/or a defined bit pattern associated with the digital code. In an aspect, the DAC can generate the offset value to nullify the duty-cycle distortion error associated with output of the transmitter. In certain embodiments, the DAC can be employed to supply a portion of a bias current (e.g., via the offset value) for a pair of transistors (e.g., an input differential pair of transistors) of the amplifier of the analog duty-cycle correction circuit. In certain embodiments, the pair of transistors of the amplifier of the analog duty-cycle correction circuit can be PMOS transistor input version. Additionally or alternatively, in certain embodiments, the DAC can be a sinking NMOS transistor current-steering DAC. In certain embodiments, the amplifier of the analog duty-cycle correction circuit can include load PMOS current source devices split into two or more switchable devices by connecting gates to either bias voltage or supply rail to turn off respective switchable devices. Additionally or alternatively, current sources of the amplifier of the analog duty-cycle correction circuit can be adjusted in differential fashion to create an offset for the amplifier.

Although not required, some aspects of the disclosed subject matter can partly be implemented via an operating system, for use by a developer of services for a device or object, and/or included within application software that operates in connection with the component(s) of the disclosed subject matter. Software may be described in the general context of computer executable instructions, such as program modules or components, being executed by one or more computer(s), such as projection display devices, viewing devices, or other devices. Those skilled in the art will appreciate that the disclosed subject matter may be practiced with other computer system configurations and protocols.

Reference throughout this specification to "one embodiment," "an embodiment," "an example," "a disclosed aspect," or "an aspect" means that a particular feature, structure, or characteristic described in connection with the embodiment or aspect is included in at least one embodiment or aspect of the present disclosure. Thus, the appearances of the phrase "in one embodiment," "in one aspect," or "in an embodiment," in various places throughout this specification are not necessarily all referring to the same embodiment. Furthermore, the particular features, structures, or characteristics may be combined in any suitable manner in various disclosed embodiments.

As utilized herein, terms "component," "system," "engine," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A system for reducing error associated with a transmitter, comprising:
 a duty-cycle correction circuit configured to adjust a clock associated with the transmitter;
 a duty-cycle distortion detector circuit configured to facilitate digital control of a duty-cycle of the clock associated with the duty-cycle correction circuit based on a duty-cycle distortion error associated with output of the transmitter;

an accumulator component configured to receive and accumulate bits of information that are indicative of the duty-cycle distortion error, and convert the bits of information to a multiple-bit duty-cycle distortion error code word that corresponds to the duty-cycle distortion error; and a core component configured to receive a first input data signal having a first defined input data bit pattern, a second input data signal having a second defined input data bit pattern, a first clock signal associated with the clock, and a second clock signal associated with the clock, wherein the output comprises a first output data signal and a second output data signal generated based on the first input data signal, the second input data signal, the first clock signal, and the second clock signal, wherein the duty-cycle distortion detector circuit is configured to determine a first average value of the first output data signal and a second average value of the second output data signal, determine a differential average value of the first average value and the second average value based on a comparison of the first average value to the second average value, and determine the duty-cycle distortion error, based on the differential average value, wherein the bits of information comprise the differential average value, wherein the multiple-bit duty-cycle distortion error code word is determined based on the differential average value, wherein an offset signal corresponding to an offset value is generated based on the multiple-bit duty-cycle distortion error code word indicative of the duty-cycle distortion error, the offset signal comprising a bias current that corresponds to the offset value and is applied to drains of transistors, comprising a differential pair of transistors, of an amplifier of the duty-cycle correction circuit, and, to reduce the duty-cycle distortion error, the duty-cycle correction circuit is configured to adjust the clock to adjust the first clock signal and the second clock signal applied to the core component based on the bias current applied to the drains of the transistors of the amplifier of the duty-cycle correction circuit;

a set of switches associated with a gate of a transistor; and a current source device configured to facilitate applying the offset signal to the amplifier of the duty-cycle correction circuit:

at a first time, control a switch of the set of switches to place the switch in a first state to provide a bias voltage to the gate of the transistor to switch the transistor to an on state; and at a second time, control the switch to place the switch in a second state to discontinue providing the bias voltage to the gate of the transistor to switch the transistor to an off state.

2. The system of claim 1, wherein the duty-cycle distortion detector circuit comprises the accumulator component, wherein the duty-cycle distortion detector circuit is configured to generate a digital code associated with the duty-cycle distortion error, and the digital code is generated based on error information indicative of the duty-cycle distortion error, and wherein the digital code comprises the multiple-bit duty-cycle distortion error code word.

3. The system of claim 1, wherein the duty-cycle distortion detector circuit comprises the accumulator component, wherein the duty-cycle distortion detector circuit is configured to provide a digital code associated with the duty-cycle distortion error to a digital logic circuit that generates a defined bit pattern, and the digital code is generated based on error information indicative of the duty-cycle distortion error, and wherein the digital code comprises the multiple-bit duty-cycle distortion error code word.

4. The system of claim 1, further comprising a digital logic circuit configured for providing a defined bit pattern associated with the duty-cycle distortion error to a digital-to-analog converter that digitally controls the duty-cycle of the clock, wherein the defined bit pattern corresponds to error information indicative of the duty-cycle distortion error.

5. The system of claim 1, further comprising a digital-to-analog converter configured for generating the offset signal corresponding to the offset value for the amplifier of the duty-cycle correction circuit based on the duty-cycle distortion error.

6. The system of claim 1, wherein the duty-cycle distortion detector circuit is configured to measure the duty-cycle distortion error associated with the transmitter as a function of the first output data signal and the second output data signal.

7. The system of claim 6, wherein the duty-cycle distortion detector circuit comprises the accumulator component, wherein the duty-cycle distortion detector circuit is configured to compare the first average value of the first output data signal and the second average value of the second output data signal to facilitate generation of a digital code associated with the duty-cycle distortion error, and the digital code is generated based on error information indicative of the duty-cycle distortion error, and wherein the digital code comprises the multiple-bit duty-cycle distortion error code word.

8. The system of claim 6, wherein the duty-cycle distortion detector circuit is configured to facilitate the digital control of the duty-cycle of the clock based on the comparison between the first average value of the first output data signal and the second average value of the second output data signal.

9. A system for digitally controlling an analog duty-cycle correction circuit, comprising:

a transmitter configured to generate output based on a clock associated with the analog duty-cycle correction circuit;

a duty-cycle distortion detector circuit configured to facilitate digital control of a duty-cycle of the clock associated with the analog duty-cycle correction circuit based on a duty-cycle distortion error associated with the output of the transmitter;

an accumulator component configured to receive and accumulate bits of data that are representative of the duty-cycle distortion error, and convert the bits of data to a multiple-bit duty-cycle distortion error code word that is indicative of the duty-cycle distortion error;

a core component configured to receive a first input data stream having a first defined data pattern, a second input data stream having a second defined data pattern, a first clock signal associated with the clock, and a second clock signal associated with the clock, wherein the output comprises a first output data stream and a second output data stream generated based on the first input data stream, the second input data stream, the first clock signal, and the second clock signal, the duty-cycle distortion detector circuit is configured to determine a first average value of the first output data stream and a second average value of the second output data stream, determine a differential average value of the first average value and the second average value, and determine the duty-cycle distortion error, based on the differential average value, wherein the bits of data comprise the differential average value, wherein the multiple-bit duty-cycle distortion error code word is generated based on the differential average value, and wherein an offset value is determined based on the multiple-bit duty-cycle distortion error code word associated with the duty-cycle distortion error, and wherein a bias current corresponding to the offset value is generated, based on the multiple-bit duty-cycle distortion error code word, and is applied to drains of transistors of an amplifier of the analog duty-cycle correction circuit to control the analog duty-cycle correction circuit to modify the first clock signal and the second clock signal, based on the offset value, to mitigate the duty-cycle distortion error;

a set of switches associated with a gate of a transistor; and a current source device configured to facilitate applying the offset signal to the amplifier of the analog duty-cycle correction circuit:
  at a first time, control a switch of the set of switches to place the switch in a first state to provide a bias voltage to the gate of the transistor to switch the transistor to an on state; and
  at a second time, control the switch to place the switch in a second state to discontinue providing the bias voltage to the gate of the transistor to switch the transistor to an off state.

10. The system of claim 9, wherein the duty-cycle distortion detector circuit comprises the accumulator component, wherein the duty-cycle distortion detector circuit is configured to generate a digital code associated with the duty-cycle distortion error, wherein the accumulator component is configured to generate the digital code based on error data associated with the duty-cycle distortion error, and wherein the digital code comprises the multiple-bit duty-cycle distortion error code word.

11. The system of claim 9, wherein the duty-cycle distortion detector circuit comprises the accumulator component, wherein the duty-cycle distortion detector circuit is configured to provide a digital code associated with the duty-cycle distortion error to a digital logic circuit that generates a defined bit pattern, wherein the accumulator component is configured to generate the digital code based on error data associated with the duty-cycle distortion error, and wherein the digital code comprises the multiple-bit duty-cycle distortion error code word.

12. The system of claim 9, further comprising a digital logic circuit configured for providing a defined bit pattern associated with the duty-cycle distortion error to a digital-to-analog converter that digitally controls the duty-cycle of the clock, wherein the defined bit pattern is generated based on error data associated with the duty-cycle distortion error.

13. The system of claim 9, further comprising a digital-to-analog converter configured for generating the offset value for the amplifier of the analog duty-cycle correction circuit based on the duty-cycle distortion error.

14. The system of claim 9, wherein the duty-cycle distortion detector circuit is configured to measure the duty-cycle distortion error associated with the transmitter based on the first output data stream and the second output data stream.

15. The system of claim 14, wherein the duty-cycle distortion detector circuit comprises the accumulator component, wherein the duty-cycle distortion detector circuit is configured to compare the first average value of the first output data stream and the second average value of the second output data stream to facilitate generation of a digital code associated with the duty-cycle distortion error, wherein the accumulator component is configured to generate the digital code based on error data associated with the duty-cycle distortion error, and wherein the digital code comprises the multiple-bit duty-cycle distortion error code word.

16. The system of claim 14, wherein the duty-cycle distortion detector circuit is configured to facilitate the digital control of the duty-cycle of the clock based on the comparison between the first average value of the first output data stream and the second average value of the second output data stream.

17. A method, comprising:
  generating output, comprising a first output data signal and a second output data signal, of a transmitter, based on a first input data signal having a first defined input data bit pattern, a second input data signal having a second defined input data bit pattern, and a first clock signal and a second clock signal associated with a clock associated with an analog duty-cycle correction circuit;
  determining a first average value of the first output data signal and a second average value of the second output data signal;
  determining a differential average value of the first average value and the second average value based on comparing the first average value to the second average value;
  determining a duty-cycle distortion error associated with the output of the transmitter based on the differential average value;
  accumulating bits of data that are indicative of the duty-cycle distortion error, wherein the bits of data comprise the differential average value;
  generating a digital multiple-bit duty-cycle distortion error code word associated with the duty-cycle distortion error based on the differential average value;
  based on the digital multiple-bit duty-cycle distortion error code word associated with the duty-cycle distortion error, generating an offset signal comprising a bias current corresponding to an offset value that is applied to drains of transistors of an amplifier of the analog duty-cycle correction circuit to control a duty-cycle of the clock associated with the analog duty-cycle correction circuit to control the first clock signal and the second clock signal;
  associating a set of switches with a gate of a transistor; and
  to facilitate applying the offset signal to the amplifier of the analog duty-cycle correction circuit:
    at a first time, controlling a switch of the set of switches to place the switch in a first state to provide a bias voltage to the gate of the transistor to switch the transistor to an on state; and
    at a second time, controlling the switch to place the switch in a second state to discontinue providing the bias voltage to the gate of the transistor to switch the transistor to an off state.

18. The method of claim 17, wherein the generating of the offset signal comprises generating the offset signal using a digital-to-analog converter that provides the bias current associated with the duty-cycle distortion error to the drains of the transistors of the amplifier of the analog duty-cycle correction circuit, the bias current being determined based on the digital multiple-bit duty-cycle distortion error code word.

19. The method of claim 17, further comprising:
providing a defined bit pattern associated with the duty-cycle distortion error to a digital-to-analog converter, wherein the defined bit pattern is generated based on the digital multiple-bit duty-cycle distortion error code word.

\* \* \* \* \*